US008811093B2

(12) United States Patent
Tran et al.

(10) Patent No.: US 8,811,093 B2
(45) Date of Patent: Aug. 19, 2014

(54) NON-VOLATILE MEMORY DEVICE AND A METHOD OF OPERATING SAME

(75) Inventors: Hieu Van Tran, San Jose, CA (US); Hung Quoc Nguyen, Fremont, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 337 days.

(21) Appl. No.: 13/419,269

(22) Filed: Mar. 13, 2012

(65) Prior Publication Data
US 2013/0242672 A1 Sep. 19, 2013

(51) Int. Cl.
*G11C 16/04* (2006.01)

(52) U.S. Cl.
CPC ...................................... *G11C 16/04* (2013.01)
USPC .................................................. 365/185.29

(58) Field of Classification Search
CPC ...................................................... G11C 16/04
USPC .................................................... 365/185.29
See application file for complete search history.

(56) References Cited

U.S. PATENT DOCUMENTS

| 4,599,706 | A | 7/1986 | Guterman | |
|---|---|---|---|---|
| 6,134,144 | A | 10/2000 | Lin et al. | |
| 6,392,933 | B1 | 5/2002 | Yoshida | |
| 6,480,436 | B2 | 11/2002 | Confalonieri et al. | |
| 7,868,375 | B2 | 1/2011 | Liu et al. | |
| 2002/0071314 | A1* | 6/2002 | Sakakibara et al. | 365/185.22 |
| 2003/0002347 | A1* | 1/2003 | Seki et al. | 365/185.29 |
| 2004/0202019 | A1* | 10/2004 | Seki et al. | 365/185.01 |
| 2004/0202025 | A1* | 10/2004 | Seki et al. | 365/185.29 |
| 2006/0023503 | A1* | 2/2006 | Lee | 365/185.05 |
| 2006/0262605 | A1* | 11/2006 | Seki et al. | 365/185.29 |
| 2007/0201299 | A1* | 8/2007 | Kanda et al. | 365/230.06 |
| 2009/0323432 | A1 | 12/2009 | Futatsuyama et al. | |
| 2011/0267896 | A1 | 11/2011 | Kim | |

OTHER PUBLICATIONS

PCT Search Report and Written Opinion dated Apr. 15, 2013 corresponding to the related PCT Patent Application No. US2013/025139.

* cited by examiner

*Primary Examiner* — Harry W Byrne
(74) *Attorney, Agent, or Firm* — DLA Piper LLP (US)

(57) ABSTRACT

An array of non-volatile memory cells in a semiconductor substrate of a first conductivity type. Each memory cell comprises first and second regions of a second conductivity type on a surface of the substrate, with a channel region therebetween. A word line overlies one portion of the channel region, is adjacent to the first region, and has little or no overlap with the first region. A floating gate overlies another portion of the channel region, and is adjacent to the first portion and the second region. A coupling gate overlies the floating gate. An erase gate overlies the second region. A bit line is connected to the first region. A negative charge pump circuit generates a negative voltage. A control circuit generates a plurality of control signals in response to receiving a command signal, and applies the negative voltage to the word line of unselected memory cells.

27 Claims, 18 Drawing Sheets

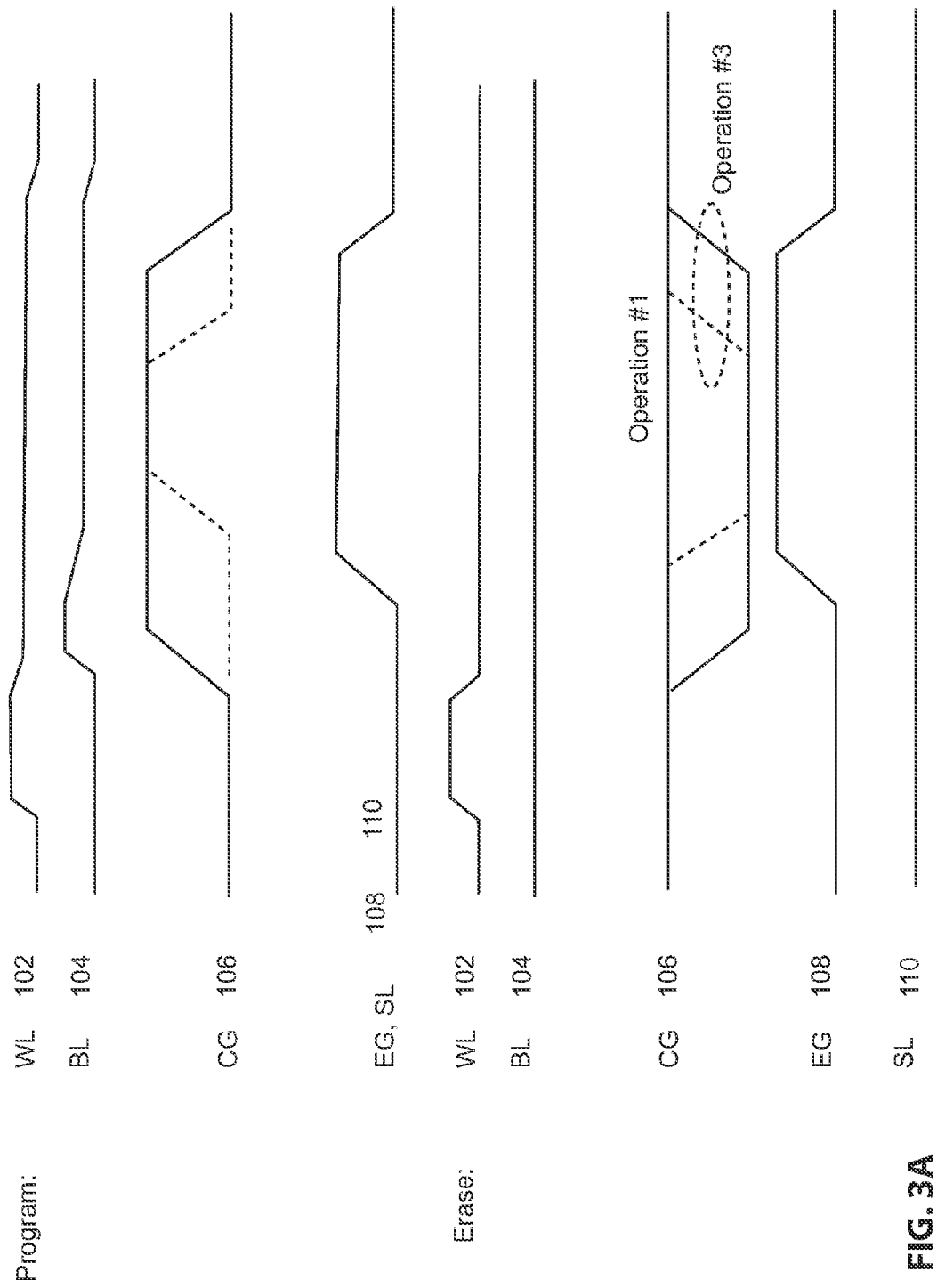

Read Normal:

Read Margin0:

Read Margin1:

Note: double GRs both PH and NH

NON-VOLATILE MEMORY DEVICE AND A METHOD OF OPERATING SAME

TECHNICAL FIELD

The present invention relates to a non-volatile memory cell device and a method of operating same. More particularly, the present invention relates to such memory device in which a negative voltage is applied to the word line and selectively in combination with other terminals of the unselected memory cells during the operations of read, program or erase.

BACKGROUND OF THE INVENTION

Non-volatile memory cells are well known in the art. One prior art non-volatile memory cell 10 is shown in FIG. 1. The memory cell 10 comprises a semiconductor substrate 12 of a first conductivity type, such as P type. The substrate 12 has a surface on which there is formed a first region 14 (also known as the source line SL) of a second conductivity type, such as N type. A second region 16 (also known as the drain line) also of N type is formed on the surface of the substrate 12. Between the first region 14 and the second region 16 is a channel region 18. A bit line BL 20 is connected to the second region 16. A word line WL 22 is positioned above a first portion of the channel region 18 and is insulated therefrom. The word line 22 has little or no over lap with the second region 16. A floating gate FG 24 is over another portion of the channel region 18. The floating gate 24 is insulated therefrom, and is adjacent to the word line 22. The floating gate 24 is also adjacent to the first region 14. A coupling gate CG (also known as control gate) 26 is over the floating gate 24 and is insulated therefrom. An erase gate EG 28 is over the first region 14 and is adjacent to the floating gate 24 and the coupling gate 26 and is insulated therefrom. The erase gate 28 is also insulated from the first region 14. The cell 10 is more particularly described in U.S. Pat. No. 7,868,375 whose disclosure is incorporated herein by reference in its entirety.

Although U.S. Pat. No. 7,868,375 discloses the application of a negative voltage to the coupling gate 26 of the memory cell 10 during the erase operation, the reference does not disclose the benefit of applying a negative voltage to other gates during other operations such as read and program.

Accordingly, one object of the present invention is the disclosure of a non-volatile memory cell device that applies a negative voltage to other gates or terminals during other operations.

SUMMARY OF THE INVENTION

The present invention relates to a non-volatile memory device that has a semiconductor substrate of a first conductivity type. An array of non-volatile memory cells is in the semiconductor substrate arranged in a plurality of rows and columns. Each memory cell comprises a first region on a surface of the semiconductor substrate of a second conductivity type, and a second region on the surface of the semiconductor substrate of the second conductivity type. A channel region is between the first region and the second region. A word line overlies a first portion of the channel region and is insulated therefrom, and adjacent to the first region and having little or no overlap with the first region. A floating gate overlies a second portion of the channel region, is adjacent to the first portion, and is insulated therefrom and is adjacent to the second region. A coupling gate overlies the floating gate. An erase gate overlies the second region and is insulated therefrom. A bit line is connected to the first region. A negative charge pump circuit generates a first negative voltage. A control circuit receives a command signal and generates a plurality of control signals, in response thereto and applies the first negative voltage to the word line of the unselected memory cells.

The present invention also relates to a method of operating a non-volatile memory cell device of the foregoing type.

BRIEF DESCRIPTION OF THE DRAWINGS

FIGS. 3A and 3B are waveform diagrams of program/erase and read operations, respectively, for use in the memory device of the present invention.

DETAILED DESCRIPTION OF THE PREFERRED EMBODIMENT

Figure 1:
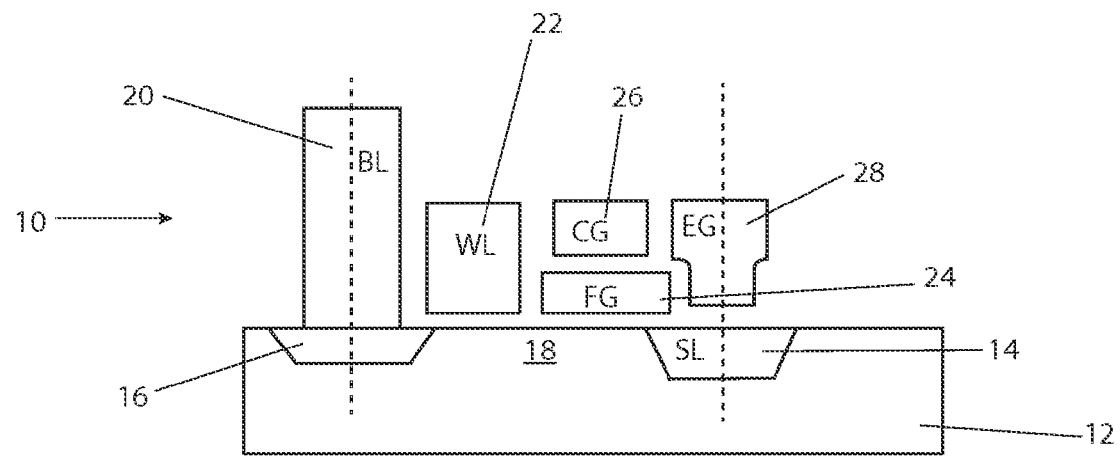
FIG. 1 is a cross-sectional view of a non-volatile memory cell of the prior art to which the method of the present invention can be applied.
Figure 2:
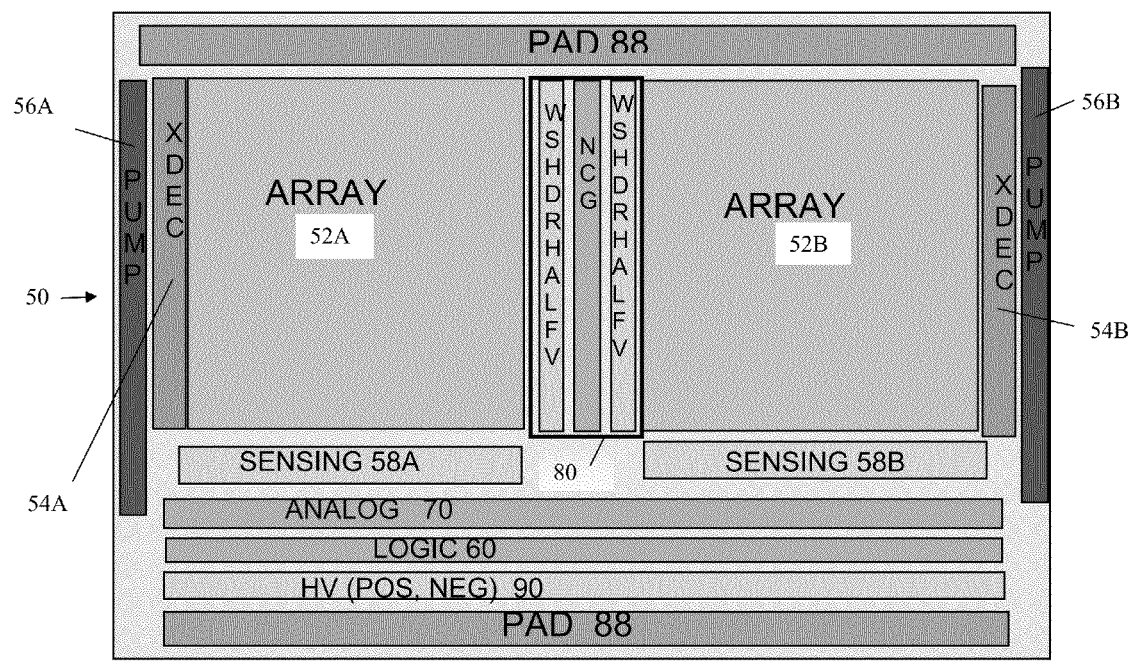
FIG. 2 is a block diagram of a non-volatile memory device of the present invention using the non-volatile memory cell of the prior art shown in FIG. 1.

Referring to FIG. 2 there is shown a block level diagram of a non-volatile memory device 50 of the present invention. In the embodiment shown in FIG. 2, the memory device 50 comprises two arrays 52A and 52B of non-volatile memory cells 10 of the type shown in FIG. 1, arranged in a plurality of rows and columns in a semiconductor substrate 12. Adjacent to each array 52 of non-volatile memory cells 10 is a decoder (Xdecoder 54A and 54B, respectively), for receiving address signals to be decoded and supplied to the word lines 22 of selected and unselected memory cells 10. Each of decoders 54 also has an associate negative charge pump included in a charge pump 56 to generate a negative voltage. A decoder (WSHDRHALFV, NCG) 80 placed in between the array 52A and 52B provides voltage levels for the control gate 26, the sourceline 14, and the erase gate 28 as shown in embodiments in FIG. 5-7.

Each of the memory arrays 52 of the memory device 50 also has a plurality of sensors 58 associated therewith to receive the signals from the memory cells 10 from the array 52 and to generate output signals from the device 50. The memory device 50 also has a logic circuit 60. The logic circuit 60 receives commands such as program, erase or read issue by a host controller (not shown), external to the memory device 50 to cause the memory device 50 to execute the various commands. In response to the commands received, the logic circuit 50 generates control signals that control the operation and the timing of the charge pump circuits 56 and the decoding circuits 54, and sense amplifier circuits 58. The analog circuit 70 provides analog bias voltages and currents and timing for the device 50. A high voltage (positive, negative) control circuit 90 provides regulated and time-sequenced positive and negative levels. A pad circuit 88 provides input buffers, IO buffers, Power pads (Vdd,Vss), Test pads, and ESD protection.

In response to the read, erase or program command, the logic circuit 60 causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), coupling gate 26 (CG), erase gate 28 (EG).

| Read Command | | | | | |
|---|---|---|---|---|---|
| Memory Cell | WL | BL | CG | EG | SL |
| Selected | 1.0-2.0 v | 0.6-2.0 v | 0.0-2.6 v | 0.0-2.6 v | 0.0 v |
| Unselected | −0.5-0.0 v | 0.0 v | 0.0-2.6 v | 0.0-2.6 v | 0.0 v |

| Erase Command | | | | | |
|---|---|---|---|---|---|
| Memory Cell | WL | BL | CG | EG | SL |
| Selected | −0.5-0.0 v | 0.0 v | 0.0 v | 11.5-12.0 v | 0.0 v |
| Unselected | −0.5-0.0 v | 0.0 v | 0.0-2.6 v | 0.0-2.6 v | 0.0 v |

Alternatively, the erase command can be performed with the following voltages:

| Erase Command | | | | | |
|---|---|---|---|---|---|
| Memory Cell | WL | BL | CG | EG | SL |
| Selected | −0.5-0.0 v | 0.0 v | −(5.0-9.0) v | 8.0-9.0 v | 0.0 v |
| Unselected | −0.5-0.0 v | 0.0 v | 0.0-2.6 v | 0.0-2.6 v | 0.0 v |

Alternatively, the erase operation can be performed with P substrate 12 being negative instead of 0v, e.g., Vsub=−6v, in this case, the voltage on the wordline WL 22 is =<−4v (to prevent WL oxide breakdown).

| Program Command | | | | | |
|---|---|---|---|---|---|
| Memory Cell | WL | BL | CG | EG | SL |
| Selected | 1.0 v | 1 uA | 10.0-11.0 v | 4.5-5.0 v | 4.5-5.0 v |
| Un-selected | −0.5-0.0 v | Vinh (1.6-3.0 v) | 0.0-2.6 v | 0.0-2.6 v | 0.0-1.0 v |

Alternatively, the program command can be performed with the following voltages and current:

| Program Command | | | | | |
|---|---|---|---|---|---|
| Memory Cell | WL | BL | CG | EG | SL |
| Selected | 1.0 v | 1 uA | 8.0-9.0 v | 8.0-9.0 v | 4.5-5.0 v |
| Unselected | −0.5-0.0 v | Vinh (1.6-3.0 v) | 0.0-2.6 v | 0.0-2.6 v | 0.0-1.0 v |

Alternatively, the program operation can be performed with the P substrate Vsub 12 being negative instead of 0v, e.g., −1v to −5v, in this case, the voltage on the selected wordline WL 22 is such that (VWL−Vsub)~=<2v, i.e., Vwl~=<1v to −3v (to prevent WL oxide breakdown).

Referring to FIG. 3A there is shown one example of a signal timing waveform for program and erase signals for positive/negative bias levels as described above for use in the memory device 50 of the present invention. Signals WL, BL, CG, EG, SL as corresponding respectively to terminals WL, BL, CG, EG, SL of the memory cell 10 are as described above. For programming, a signal WL 102 goes to high (e.g., ~Vdd) first (such as to set control signal in the decoder circuit 80 to be described later) then start to settle down (to a bias voltage Vpwl).

Then signal BL 104 and CG 106 goes high, e.g., ~Vinh=~Vdd and 10 to 11v respectively, and then EG and SL 110 goes high (e.g, ~4.5v to 5v). Alternatively CG 106 goes high after EG 108 and SL 110 (as shown by the dotted line waveform). The signal WL 102 settles down to a voltage Vpwl, e.g, 1v, and the signal BL 104 settles down to a voltage Vdp, e.g., ~0.5v as CG goes high. Unselected WLs goes down to negative, e.g., −0.5v, before or concurrent with selected WL 102 goes high. Unselected CGs, EGs, stays at value in standby, e.g, 0 to 2.6v. Unselected SLs stays at a value in standby, e.g., 0v or switches to a bias voltage, e.g., 1v, as CG 106 goes high (unselected SL switching to a bias level to prevent leakage current through unselected cells through the BLs).

The signal BL 104 goes first high to Vinh (inhibit voltage) to prevent inadvertent program disturb due various signals are not settled yet during ramping to programming voltages. The timed sequence CG 106 vs. EG 108 and SL 110 are optimized to reduce disturb effect, e.g. whichever signal causes more disturb goes high last. The ramping down of programming pulses are reversed in order to minimize disturb (i.e., signal that goes up first now goes down last). The signals EG 108, SL 110 goes down, then CG 106 goes down, then WL 102 and BL 104 goes down. In the embodiment of programming with the substrate P going negative, e.g., −1v, this negative switching is concurrent with the signal WL goes low or the CG or EG goes high.

For erase, the signal WL 102 goes high, e.g, Vdd, (such as to set control signal in the decoder circuit 80 to be described later as embodiments in FIG. 5-7) then goes low, e.g, 0v (or alternatively a negative such as −0.5v). At approximately same time as the WL 102 going low, the signal CG 106 goes negative, e.g, −6v to −9v, then the signal EG 108 goes high, e.g., 8 to 9v. The signals BL 104, SL 110 stays at a value in standby, e.g., 0v. Alternatively the signal CG 106 goes negative after EG 108 goes high. Unselected WLs goes down to negative, e.g., −0.5v, before or concurrent with selected WL 102 going high. Unselected CGs, EGs, stay at value in standby, e.g, 0 to 2.6v. Unselected SLs stay at a value in standby, e.g., 0v.

In the embodiment of erase with the substrate P going negative, e.g., −6v, this negative switching is concurrent with the signal WL goes low. This is to prevent stressing or breakdown of the WL gate oxide.

The ramping down of erase pulses is approximately reversed in order (i.e., signal that goes up first now goes down last). The signals EG 108 goes to standby value, e.g., 0v, then CG 106 goes to standby value, e.g., 0v.

Figure 3B:
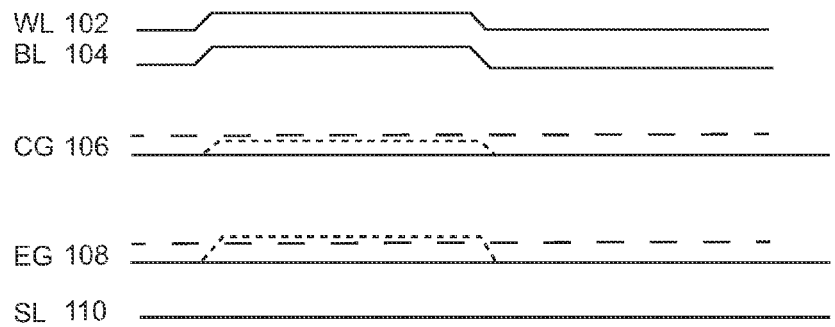
Figure 3B:
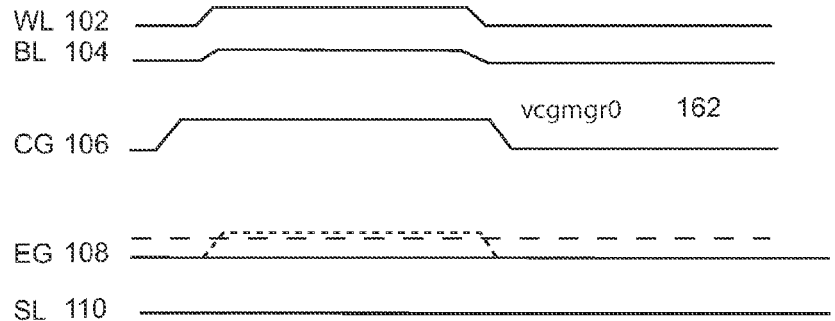
Figure 3B:
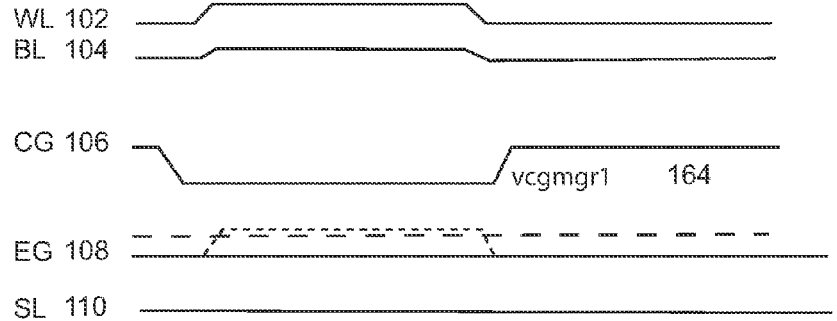

Referring to FIG. 3B there is shown one example of a signal timing waveform for read signals for positive/negative bias levels as described above for use in the memory device 50 of the present invention. This read signal waveform goes with the program and erase signal waveform in FIG. 3A for complete non-volatile erase/program/read operation. For Read Normal waveform, the SL 110 is at standby value, e.g., 0v. The CG 106 is at standby value, e.g., 0v or 2.6v, or alternatively switching to a bias value in read, e.g. 2.6v (to help increase the memory cell current due to CG voltage coupling to FG potential in read condition). The EG 106 is at standby value, e.g., 0v or 2.6v, or alternatively switching to a bias value in read, e.g. 2.6v (to help increase the memory cell current due to EG voltage coupling to FG potential in read condition). The standby values are similar to those for program and erase condition. The WL 102 and BL 104 switch to bias level in read, e.g. 2.6v and 1.0v respectively to selected memory cells for reading.

A Read Margin0 operation is performed after programming the whole array to detect weak programming cells. After programming, the cell current is at a very low value normally <nano amperes (nA), this corresponds to reading out a '0' digital value (no cell current). However some cells may marginally stay at a couple micro amperes (due to weak programming due to various reasons such as cell leakage, weak cell programming coupling ratio, process geometrical effect, etc. . . . ) and this can causing read '0' to fail during the operating lifetime of the memory device 50. A Read Margin° is used to screen out those weak cells. For Read Margin° waveform, the SL 110 is at standby value, e.g., 0v. The EG 106 is at standby value, e.g., 0v or 2.6v, or alternatively switching to a bias value in read, e.g. 2.6v as same in Read Normal condition. The WL 102 and BL 104 switch to bias level in read, e.g. 2.6v and 1.0v respectively to selected memory cells for reading as in Read Normal condition. The CG 106 is biased at a margin0 value (provided by same circuit means described in FIG. 6-8 as for program or read condition) in read, e.g. 3v, to detect weak programmed cells. The CG voltage will couple into FG potential to amplify the weak programming effect, effectively increase the cell current, so the weak cells now read as a '1' instead of a '0' (effectively there is cell current instead of no cell current).

A Read Margin1 operation is performed after erasing the whole array to detect weak erased cells. Negative CG now (provided by same circuit means described in FIG. 6-8 as for erasing with negative voltage) is utilized to detect this condition. The SL 110 is at standby value, e.g., 0v. The EG 108 is at standby value, e.g., 0v or 2.6v, or alternatively switching to a bias value in read, e.g. 2.6v as same in Read Normal condition. The WL 102 and BL 104 switch to bias level in read, e.g. 2.6v and 1.0v respectively to selected memory cells for reading as in Read Normal condition. The CG 106 is biased at a margin1 value in read, e.g. −3v, to detect weak erased cells. The CG voltage will couple negatively into FG potential to amplify the weak erased effect, effectively decrease the cell current (less FG potential), so the weak erased cells now read as a '0' instead of a '1' (effectively there is no cell current instead of cell current).

Figure 4A:
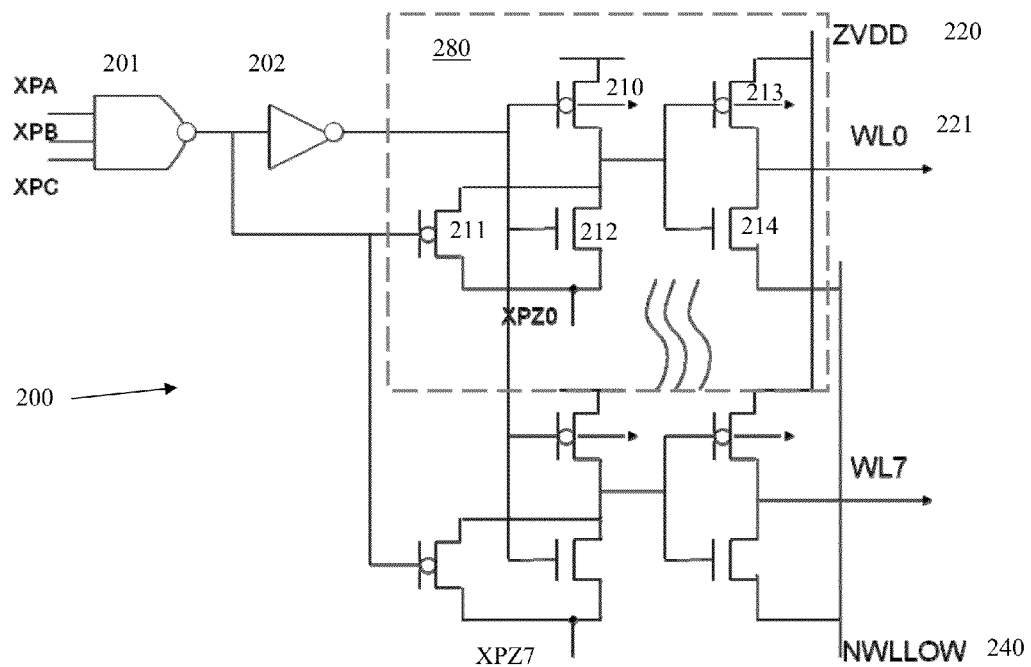
FIGS. 4A and 4B are detailed circuit diagrams of a negative/positive word line decoder circuit and negative charge pump, respectively, for use in the memory device of the present invention.

Referring to FIG. 4A there is shown one example of a circuit diagram of the Xdecoder 200 for use in the memory device 50 of the present invention. The Xdecoder circuit 200 provides the decoded address signals to be supplied to the word lines 22 of the selected and unselected memory cells 10. The Xdecoder circuit 200 operates in the following manner. NAND gate 201 and INV 202 is used for decoding wordline (row) pre-decoded signal XPA-XPC (which is called memory sector (address) selection). Circuit 280 consists of a pre-driver and a driver. PMOS transistors 210 and 211 and NMOS transistor 212 are wordline pre-driver combined with pre-decoded XPZ<0:7>. Pre-decoded signals XPZ<0:7) is used to select one row out of eight (by being='0'). PMOS transistor 213 and NMOS transistor 214 are wordline WL driver, used to drive a memory row that includes typically 2048 or 4096 cells in a row and hence needing big size transistor for wordline RC delay, i.e., large W/L ratio, W=transistor width and L=transistor length. The circuit 280 is repeated 8 times and NAND 201 and INV 202 is repeated one time for 8 rows per memory sector size. Typically the source of the transistor 214 is connected to a ground node (i.e., 0v) for de-selection condition, here it is connected to a node NWLLOW 240. The source of the transistor 213 is connected to a node ZVDD 220, which is equal to Vwlrd (read wordline voltage) in read operation, equal to Vpwl (programming wordline voltage in programming operation). For programming condition, for selected wordline, WL=ZVDD=Vpwl=1.0v for example, for unselected WLs=NWLLOW, which is equal to −0.5v. For erase condition, for selected wordline WL and un-selected WLS=NWLLOW=−0.5v in one embodiment. For read condition, for selected wordline, WL=ZVDD=Vwlrd=2v for example, for un-selected wordlines WLS=NWLLOW, which is equal to −0.5v in one embodiment.

Figure 4B:
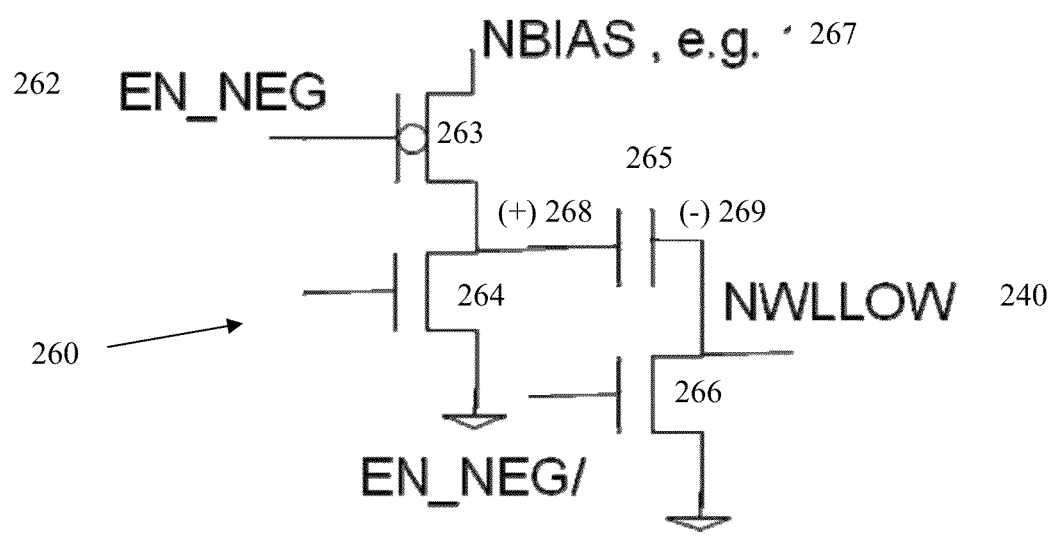

Referring to FIG. 4B there is shown one example of a circuit diagram of a negative charge pump generator 260 (which is part of the charge pump 56 that provides both negative and positive voltages) for generating a negative voltage to be supplied to the word lines 22. The negative charge pump circuit 260 operates in the following manner. In a first time period, PMOS transistor 263 and NMOS transistor 266 are used to charge (+) 268 and (−) terminal 269 of a capacitor 265 to a positive bias voltage NBIAS 267 and a ground level (i.e., 0v) respectively. In a next time period after the first period, the transistor 266 is turned off and a NMOS transistor 264 is turned on to discharge the (+) terminal 268 of the capacitor 265 from a bias level 268 to ground level. At this time, the (−) terminal 269 of the capacitor 265 will be capacitively coupled to a negative level, e.g., −0.5v, depending on value of the capacitor 265 to the capacitive loading at the node NWLLOW 240. By adjusting level of NBIAS 267 and the value of the capacitor 265, the negative level is adjusted. For the embodiment of a semiconductor process using P substrate=0v (grounded) for forming the memory device 50, e.g., single well CMOS (P-substrate for N type devices and a single N well for P type devices), the negative level is clamped at a P/N+ forward junction forward bias (~−0.6v). As is well known, the memory device 50 can be made of a twin well P-sub CMOS process, in which two wells (P well and N well) are constructed in the substrate 12. Since the substrate 12 is of P type conductivity, a first P well therein would be for N type devices (NMOS), and a second N type well would be for P type devices (PMOS). The negative voltage charge pump generator 260 and the wordline decoder 200 can be made in a triple well in the substrate 12. This is done by a triple well CMOS process instead of the twin well P-sub CMOS process described earlier. In that event, the negative pump generator 260 and the wordline decoder 200 would be made in a third P type well (which is made in the second N type well, which is inside the substrate 12) and the second N type well. This third P type well can now be applied negative voltage which is advantageous in certain operating conditions. Although constructing the memory device 50 having a triple well is more process intensive, the benefit of having the pump generator 260 and the wordline decoder 200 in a triple well is that the negative voltage applied to the word line 22 can be more negative, for example −6.0v used for an erase embodiment, (i.e. not clamped by the P/N+ junction forward bias ~−0.6v). In this case the third P type well voltage condition can be negative to avoid the P/N+ junction forward bias, e.g., −6.0v or −8.0v or −5.6v. In an embodiment the memory cell 10 can be formed in the third P type well.

Figure 5:
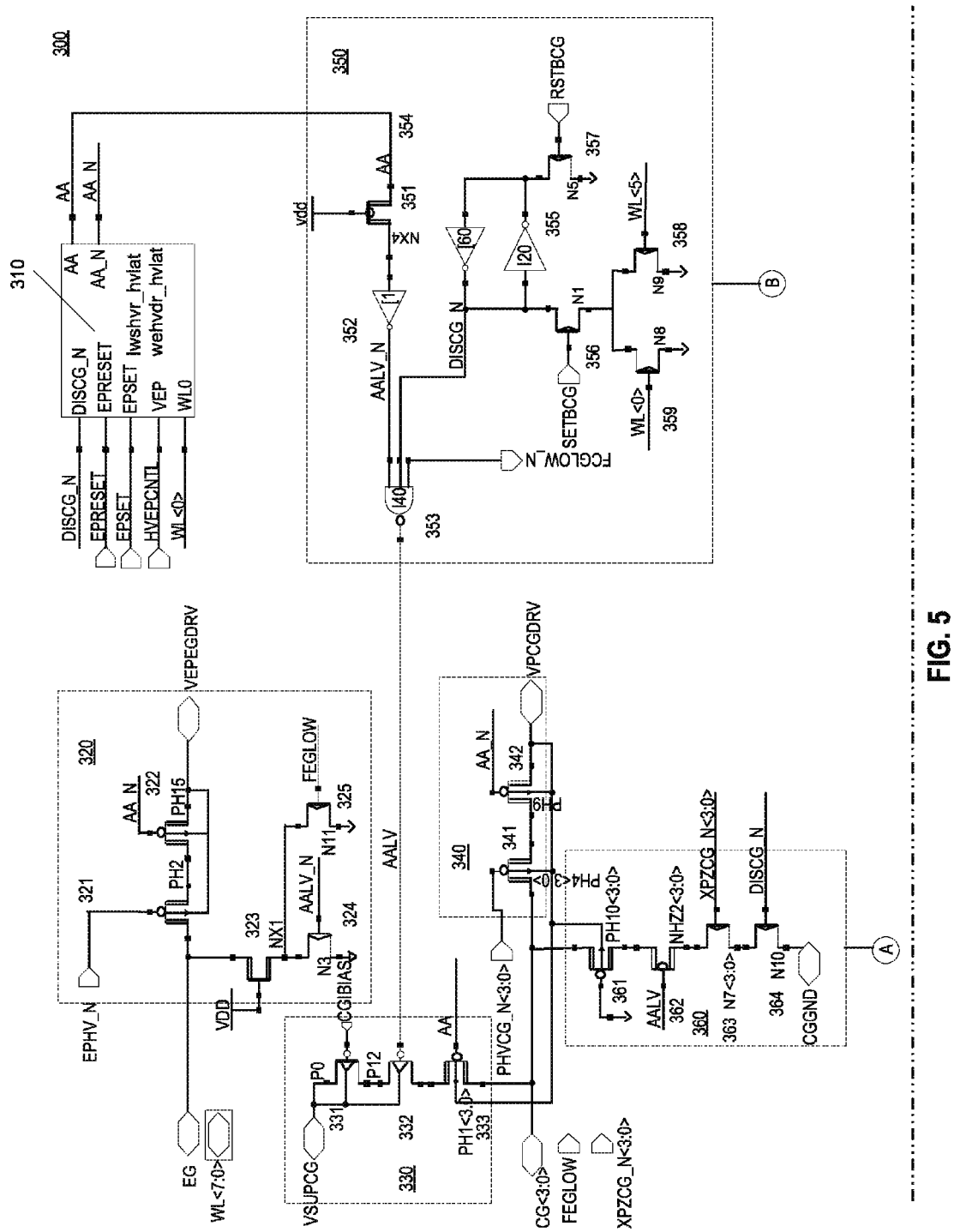
FIGS. 5 and 5A are detailed circuit diagrams of a first negative/positive high voltage decoder circuit for use in the memory device of the present invention.
Figure 5A:
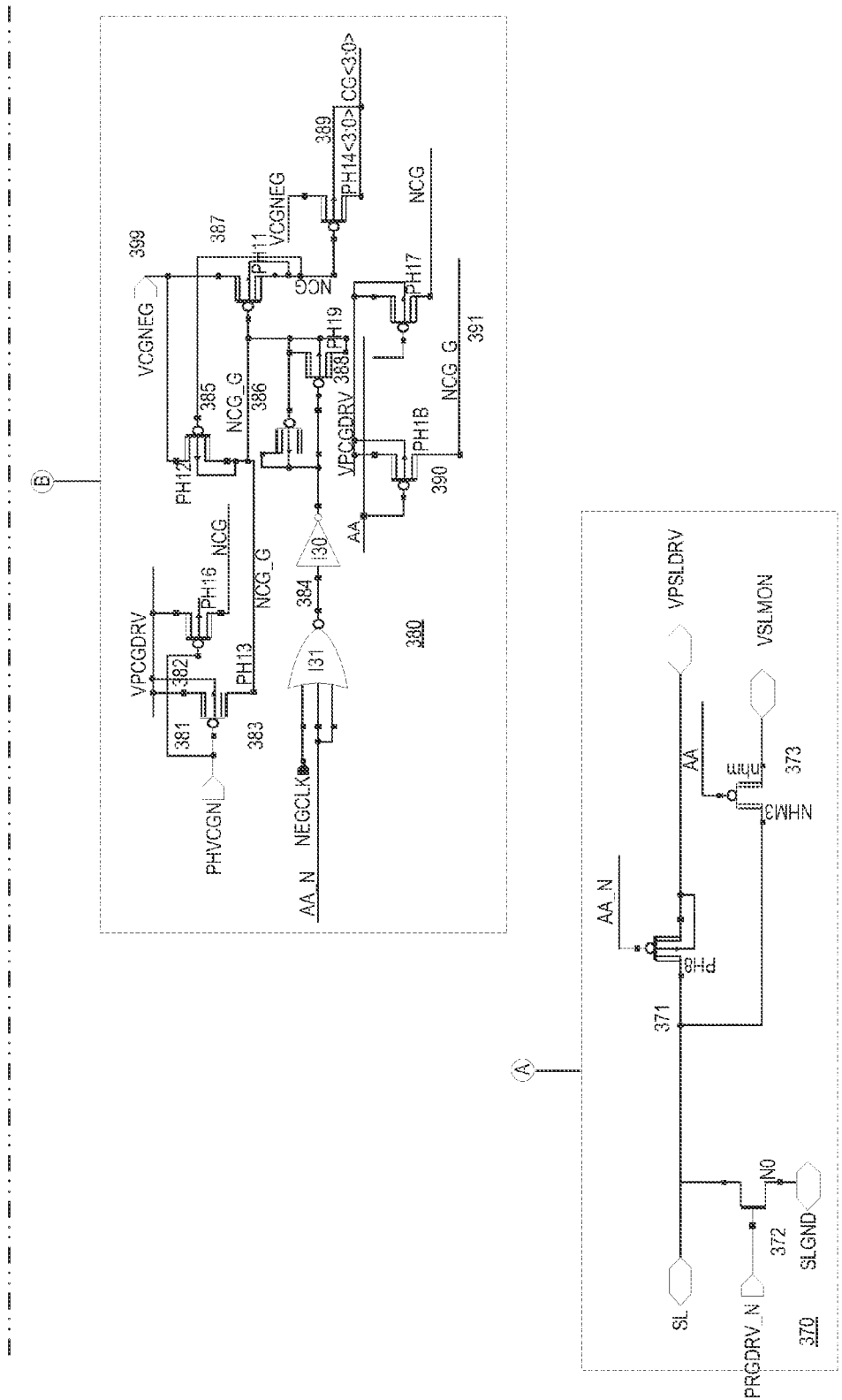

Referring to FIGS. 5 and 5A there is shown a first embodiment of a high voltage decoding circuit 300 for positive/negative level signals for use in the memory device 50 of Psub CMOS process of the present invention. A circuit 320 consisting of hv (high voltage, e.g. 12v) PMOS transistors 321 and 322 and hv NMOS transistor 323 and lv (low voltage, e.g., 3v) transistors 324 and 325 are used for decoding EG signal for erase/program/read operation. The transistor 322 (EG current limiter) is used to limit current in erase and/or program (to limit current sinking from the HV charge pump). A circuit 310 is a hv latch circuit used to enable the hv control for the sector (1 sector per 8 rows) selected, which is selected once a WL signal is asserted (~Vdd) at the beginning of the erase or programming sequence as shown in FIG. 3A. A circuit 350 consisting of native hv NMOS transistor 351, inverter 352, NAND 353, a lv latch (consisting of inverter 354 and 355 and set lv NMOS transistors 356, 359, 358 and reset lv NMOS transistor 357) is used to disable the hv signal if the sector is bad sector (not to be used). A circuit 330 consisting of lv PMOS transistors 331 and 332 and hv PMOS transistor 333 is used to provide CG bias level in standby and read. The transistor 331 (its gate is at a bias level) acts as current limiter to CG terminal to limit current from bad CG terminal such as in standby condition. A circuit 340 consisting of hv PMOS transistors 341 and 342 is used to provide CG bias level in erase/program. The transistor 341 could act as current limiter to CG terminal in erase/program to limit current supplied from HV chargepump. A circuit 360 consisting of hv PMOS transistor 361, hv native NMOS transistor 362, lv NMOS transistors 363 and 364 is used to disable the CG. A circuit 370 consisting of hv PMOS transistor 371, hv NMOS transistor 373 and lv NMOS transistor 372 is used to enable SL signal for erase/program/read condition. The lv NMOS transistor 372 is used to pulldown the SL to ground in read and erase and to a bias level, e.g. <2v, in program. A circuit 380 is a negative decoding circuit for the CG signal. The circuit 360 uses PMOS transistor 361 as isolation transistor to isolate negative level (provided by the circuit 380 going into CG terminal of memory cell) from the NMOS transistor 362 for Psub CMOS process. The circuit 380 uses clocked negatively bootstrapped high voltage circuit scheme. The circuits 380 consists of PMOS transistors 381, 382, 385-391 and NOR 384 and inverter 384. The NOR 384 and inverter 384 is used to enable a clocking signal into the PMOS transistors 386 and 388 which act as a capacitor to negatively pumping gate of the transistor 387. The transistor 385 acts as a bootstrap transistor for the PMOS transistor 387 and the PMOS capacitors 386 and 388. The transistors 381/390 and 382/391 serves to clamp the drain of the transistor 387 and the drain of the transistor 385 respectively at Vdd level. The transistor 389 serves as a buffer for negative level into CG. The sources of transistors 385 and 387 connect to a negative power supply VCGNEG 399.

Figure 6:
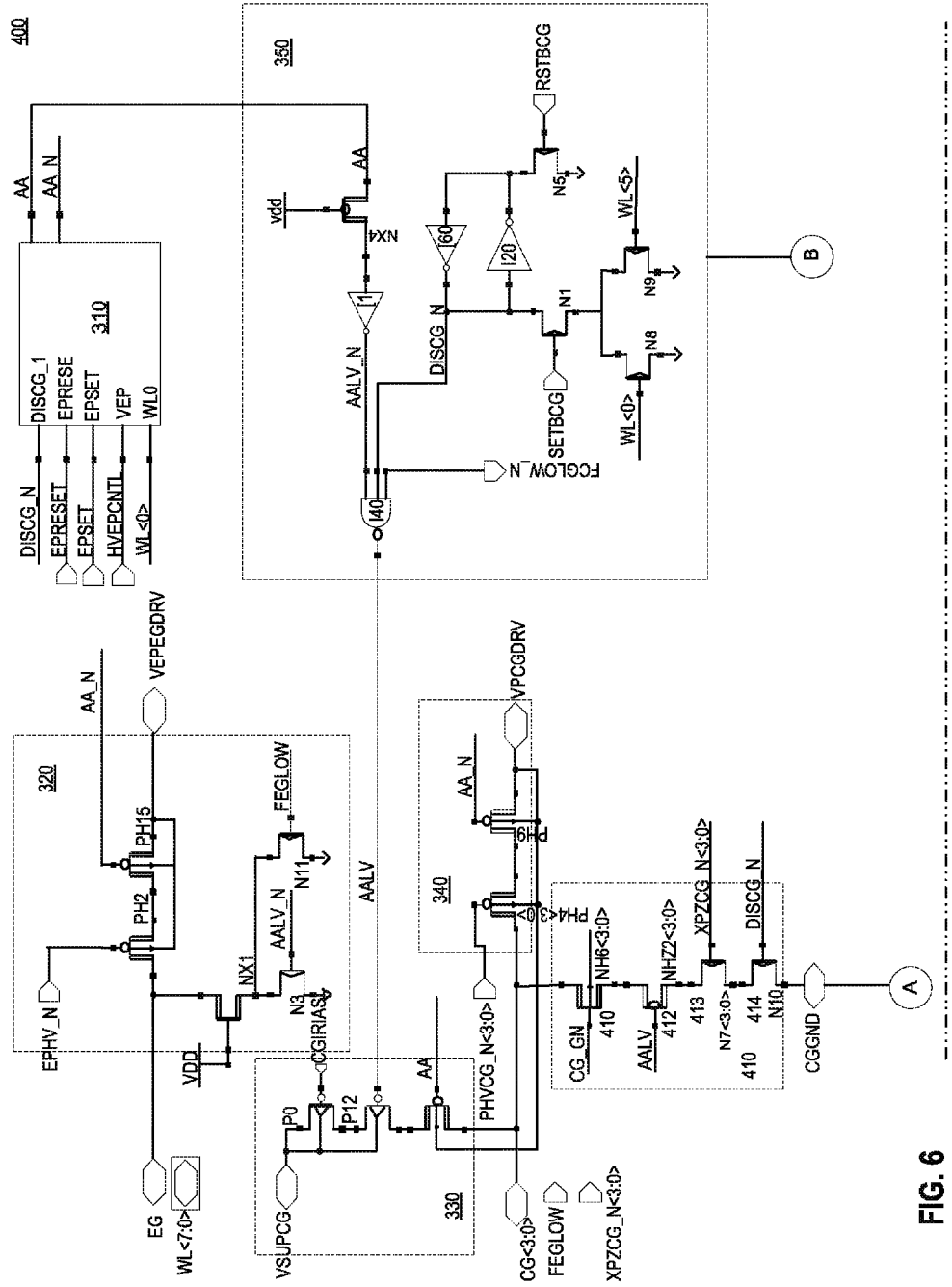
FIGS. 6 and 6A are detailed circuit diagrams of a second negative/positive high voltage decoder circuit for use in the memory device of the present invention.
Figure 6A:
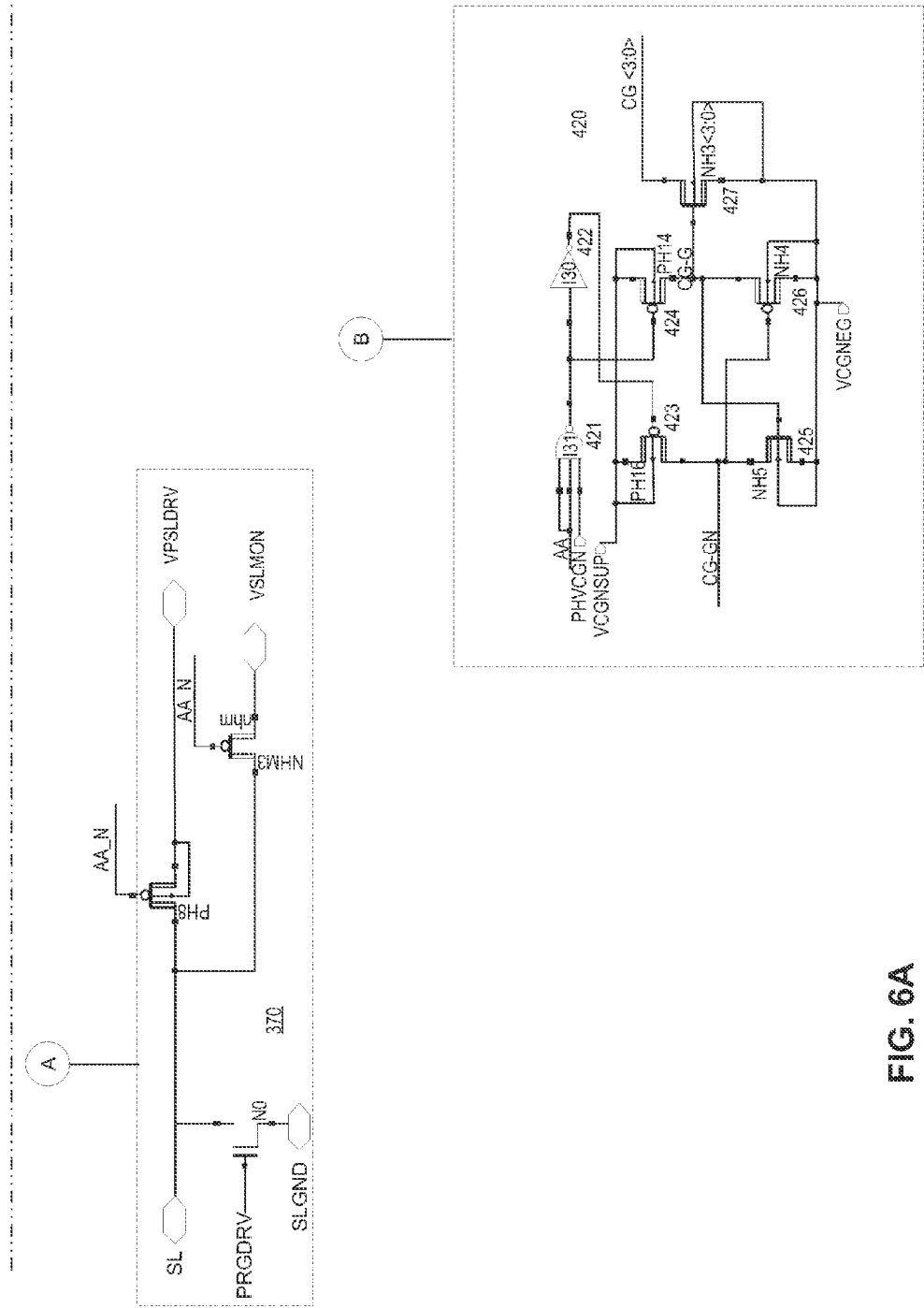

Referring to FIGS. 6 and 6A there is shown second embodiment of a high voltage decoding circuit 400 for positive/negative level signals for use in the memory device 50 of Triple well CMOS process of the present invention. The circuits 310-350, 370 are same or similar as those of FIGS. 5 and 5A. A circuit 410 consisting of hv NMOS transistor 410 and lv NMOS transistors 412-414 is used for de-selecting the CGs to a low level, e.g., 0v. The hv transistor 410 serves as isolation transistor to isolate the negative level into CGs, hence its bulk VCGNEG also at a negative level. A circuit 420, serves as a negative level shifter, is used to provide negative level for CGs. The circuit 420 consists of NAND 421, inverter 422 as enabling entity and hv PMOS transistors 423 and 424 and hv NMOS transistors 425 and 426 as a cross-coupled negative latch and hv NMOS transistor 427 as a buffer. The sources of NMOS transistors 425, 426, 427 connect to a negative power supply VCGNEG.

Figure 7:
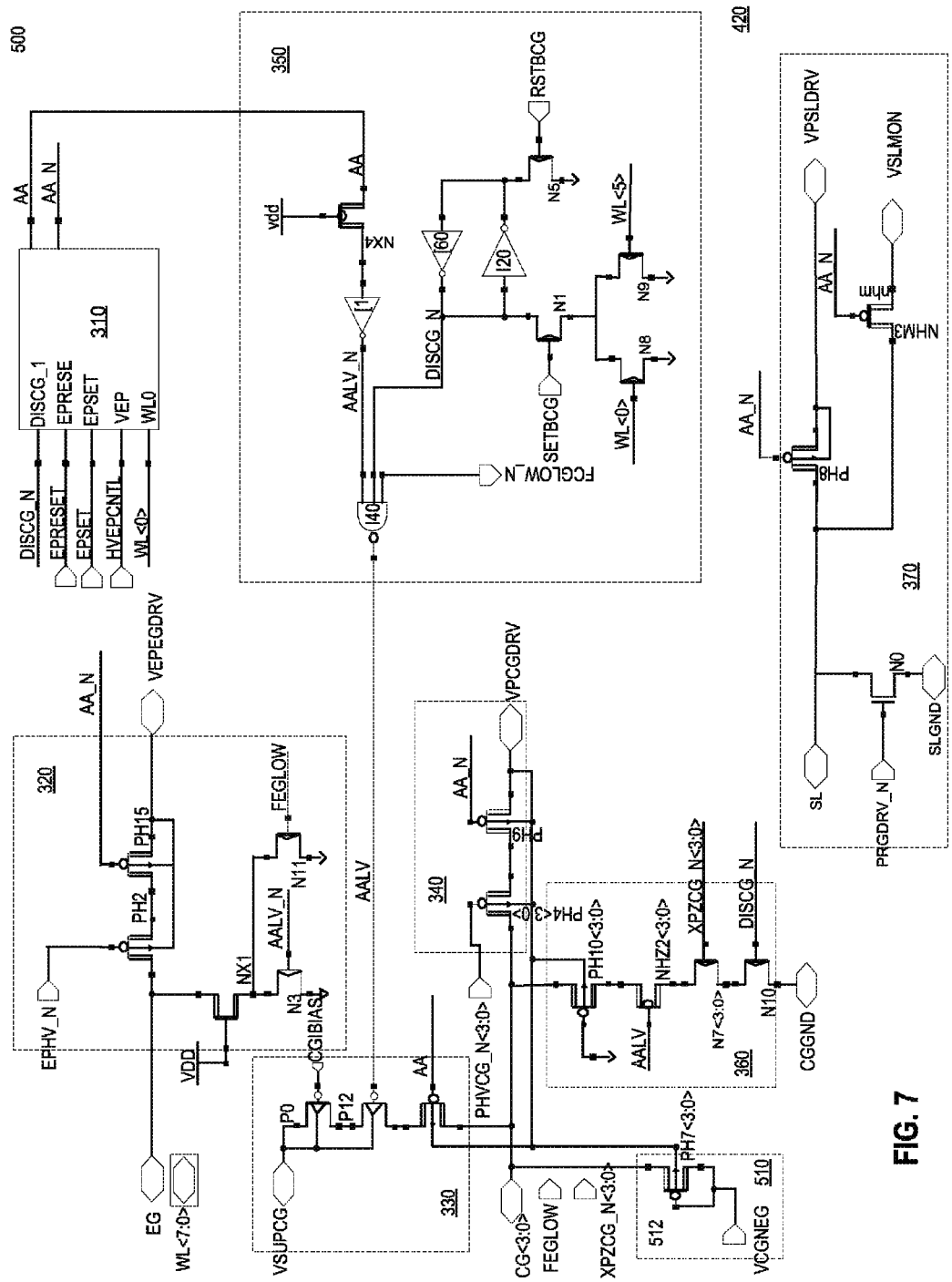
FIG. 7 is a detailed circuit diagram of a third negative/positive high voltage decoder circuit for use in the memory device of the present invention.

Referring to FIG. 7 there is shown third embodiment of a high voltage decoding circuit 420 for positive/negative level signals for use in the memory device 50 of Psub CMOS process of the present invention. It used a diode decoding scheme for negative voltage. The circuits 310-370 are same or similar as those of FIGS. 5 and 5A. A circuit 510 consisting of hv PMOS transistor 512 is used to provide negative level into CGs. The transistor 512 is diode-connected, meaning gate-drain connected together, and its gate-drain is connected to a negative power supply VCGNEG. Its source is connected to CG. Hence as the negative power supply VCGNEG goes negative, the source of the transistor goes negative by an amount=VCG NEG−|Vtp|.

Figure 8:
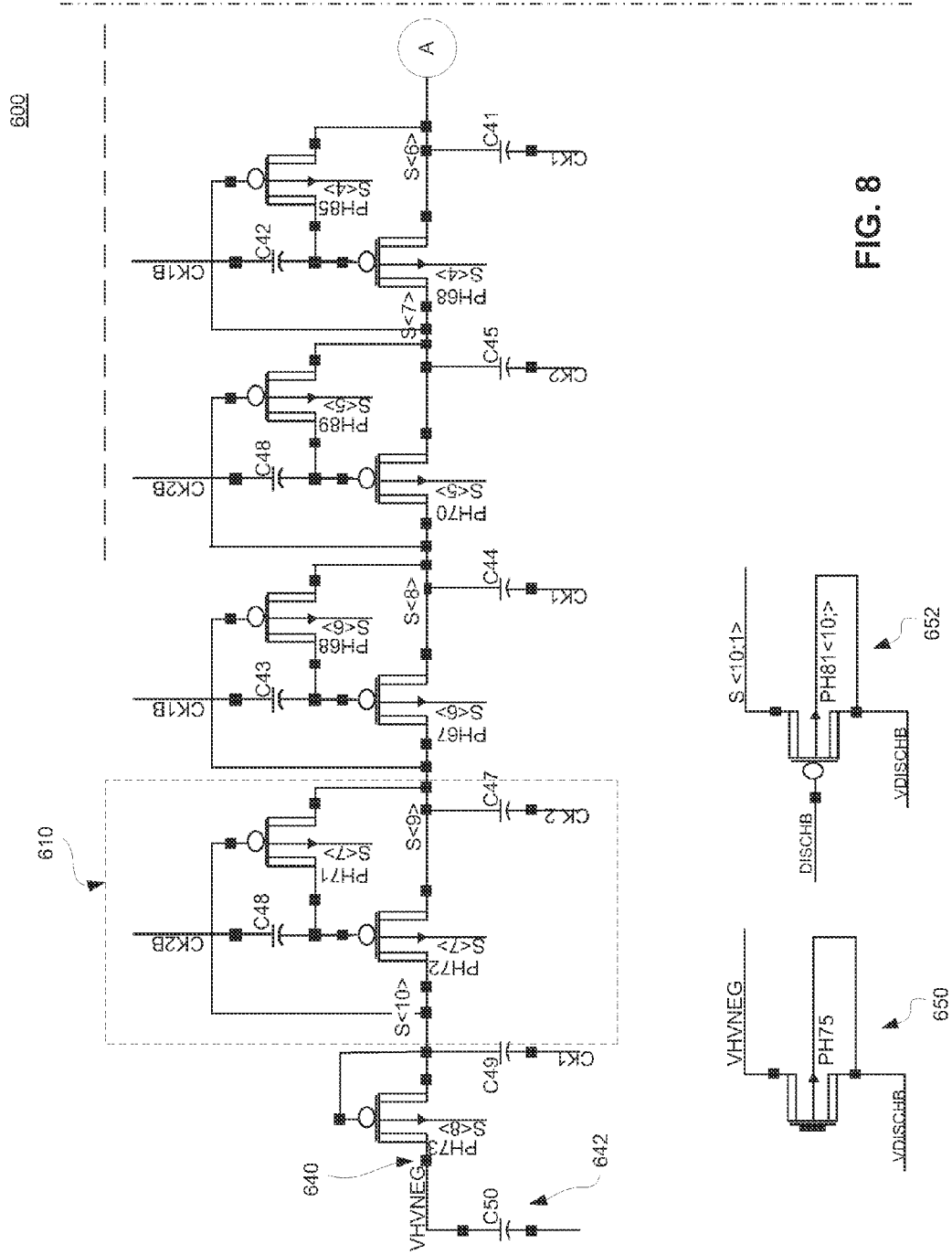
FIGS. 8 and 8A are detailed circuit diagrams of a negative voltage charge pump generator for use with the memory device of the present invention.
Figure 8A:
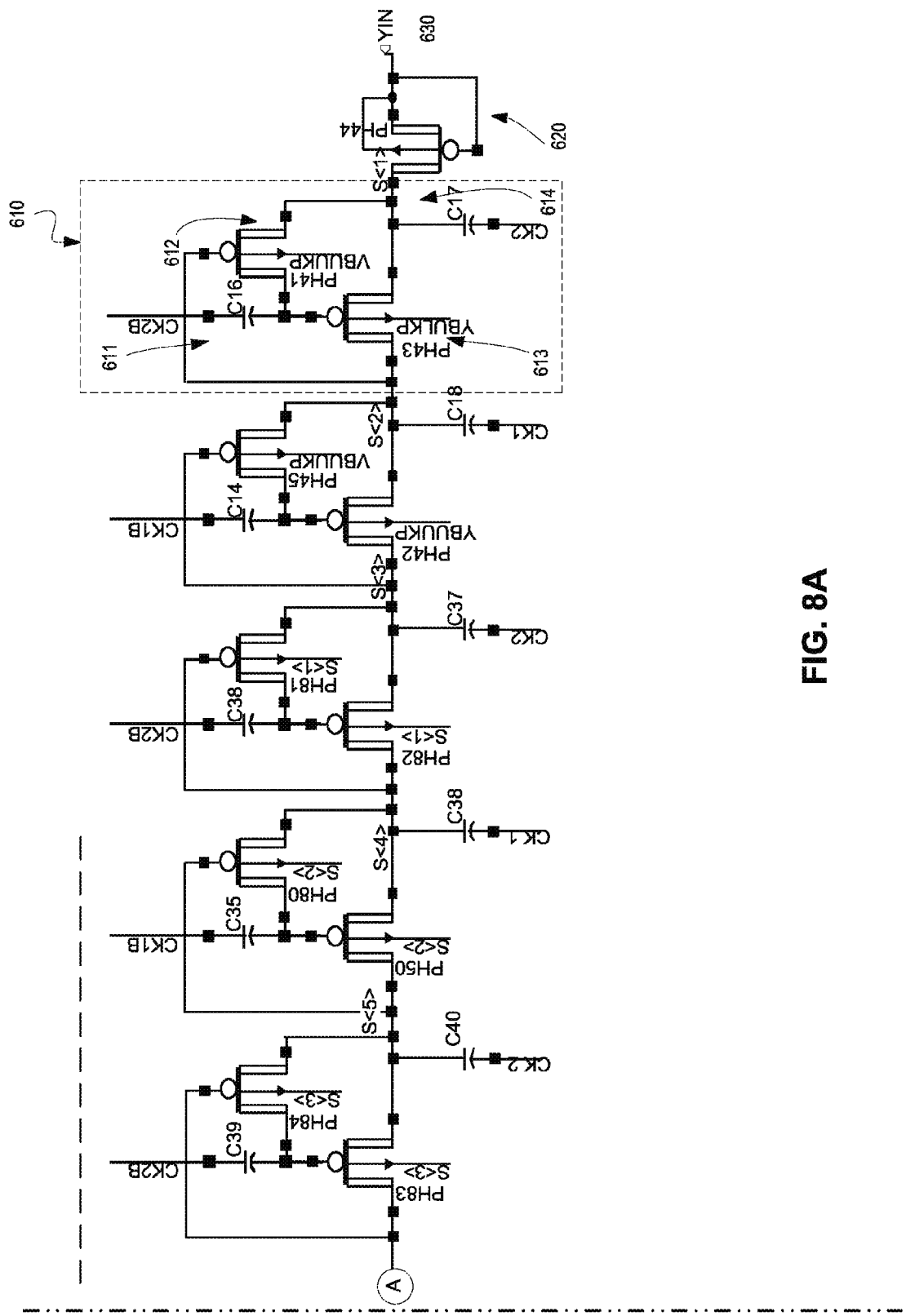

Referring to FIGS. 8 and 8A there is shown a negative charge pump 600 that generates the negative voltages that are applied to the coupling gate 26 during the erase operation. A circuit 610 consists of PMOS transistors 612 and 613 and capacitors 611 and 614 constitutes a pump stage. The transistor 613 is the transfer transistor (transferring charge from one stage to next stage). The transistor 612 and the capacitor 611 serves as Vt-cancelling function for the transferring transistor 613. The capacitor 614 is the pump capacitor (meaning provide pumping charge). A diode-connected PMOS transistor 620 connects to a power supply node to first pump stage. A diode connected PMOS transistor 640 serves to connect to an output charge pump node from last pump stage. PMOS transistors 650 and 652 serve to clamp or initialize internal pumped nodes. Various clock generation, phase driver, and biases are not shown.

Figure 9:
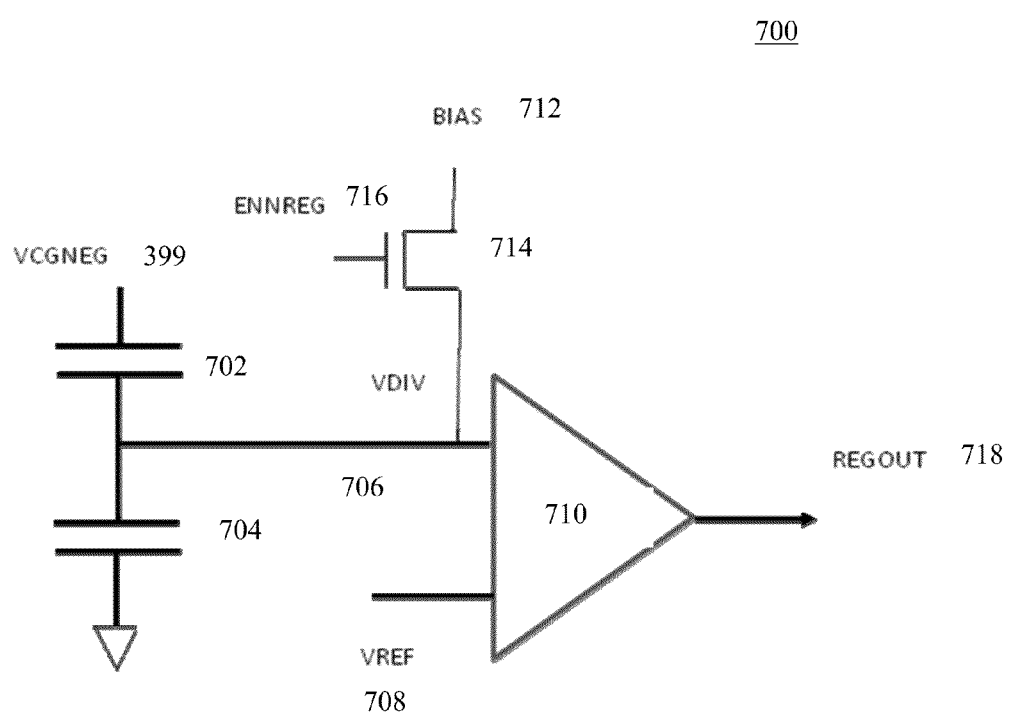
FIG. 9 is a detailed circuit diagram of a negative high voltage regulation circuit for use in the memory device of the present invention.

Referring to FIG. 9 there is shown an embodiment of a negative high voltage regulation circuit 700 for use in the memory device 50 of the present invention. Capacitors 702 and 704 are used to divide the negative voltage from the negative power supply VCGNEG 399 into a voltage to be compared with a reference voltage VREF 708, e.g. 1v. The VREF 708 is coupled to a terminal of a comparator 710. A transistor 714 is used to initialize node 706 to a bias voltage, e.g., 2v. The node 706 is coupled to other terminal of the comparator 710. As the negative supply VCGNEG 399 is pumped negative progressively from a level such as ground, the node 706 proportionally goes from a bias level, e.g. positive 2v, to progressively lower in a negative direction (by the ratio determined by values of the capacitors 702 and 704). Once the node 706 reaches a value equal to VREF 708, the comparator 710 switches polarity. The output REGOUT 718 is then used to signal that the negative power supply VCGN MEG 399 has reached a desired level such as −9v used for CG in erase condition.

Figure 10:
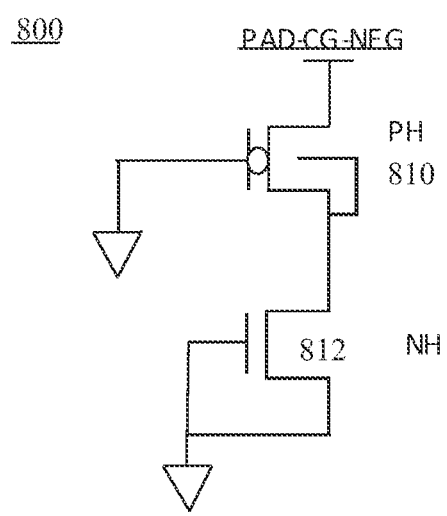
FIG. 10 is a detailed circuit diagram of a negative/positive pad circuit for use in the memory device of the present invention.

Referring to FIG. 10 there is shown an embodiment of a negative test pad circuit 800 for use in the memory device 50 in Psub CMOS process of the present invention. PMOS transistor 810 serves to isolate NMOS transistor 812 to a negative level to be transferred from internal to external pad or vice versa. The transistor 810 has its bulk connected to its drain for the purpose of isolation. The transistor 812 serves as ESD clamping.

Figure 11A:
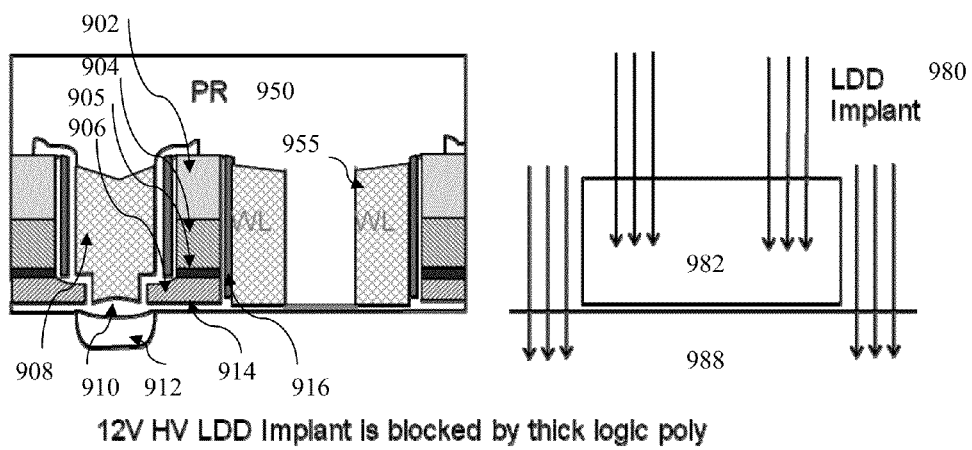
FIGS. 11A and 11B are cross sectional views showing a portion of a process flow of the prior art for use in making the memory device of the prior art.
Figure 11B:
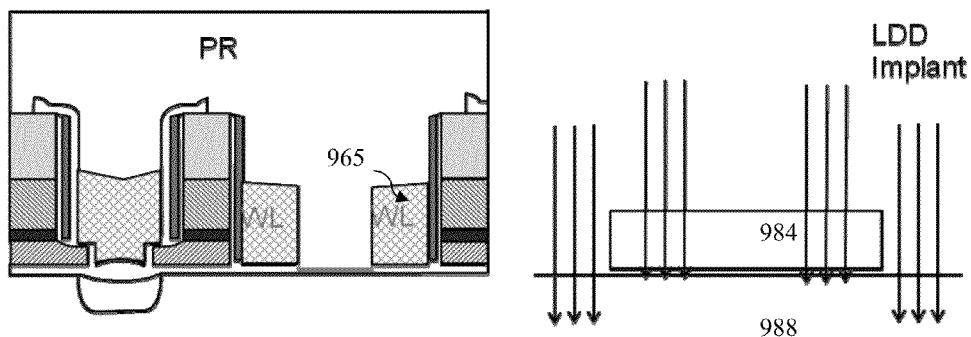

Referring to FIGS. 11A and 11B there are shown prior art embodiments of a process flow cross section 900 and 901 to produce memory cells having positive high voltage operation of the prior art. A memory cell includes layer 902 (Oxide, SIN), 904 (CG poly), 905 (ONO), 906 (FG poly), 908 (EG poly), 912 (SL diffusion layer), 910 (oxide between EG and SL), 914 (FG gate oxide), 916 (side nitride layer), 955 (WL poly). For process flow cross section 900, peripheral HV device includes 982 (gate poly), 988 (channel region underneath the gate poly), LDD 980 (LDD implant). For this case the peripheral HV gate poly 982 is thick which can stop the LDD implant 980 from going into the channel region 988. For process flow cross section 901, which is applicable to advanced smaller geometry technology node, the memory cell includes thin WL poly 965 (thin compared to the thickness of the WL 955 shown in FIG. 11A), and peripheral HV device includes 984 (gate poly), 988 (substrate), LDD 980 (LDD implant). The gate poly 984 is significantly thinner than that of the gate poly 982. In this case LDD implant 980 penetrates gate poly 984 into the channel region 988 which modulate the channel 988 electrically. This effect is undesirable. In this case additional masking and/or process layer step may be needed to stop LDD implant from penetrating into the channel.

Figure 11C:
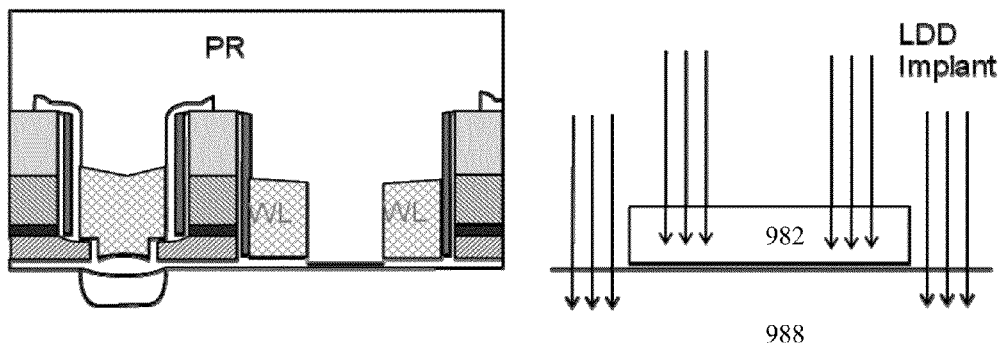
FIG. 11C is a cross sectional view showing a portion of a process flow for making the memory device of the present invention.

Referring to FIG. 11C there is shown an embodiments of a process flow for the production of memory cells 10 having negative voltage operation for use in the memory device 50 in the present invention. LDD implant 981 in this case is significantly lower energy due to the lower high voltage requirement, e.g. 9v vs. 11v for negative voltage operation. Hence in this case even with smaller geometry technology node, with thin gate poly 982 thickness, LDD implant does not penetrate into the channel 988. This process flow hence is suitable for producing memory cell for use with negative voltage operation.

The benefits of applying a negative voltage to the word line 22 of the unselected or selected memory cells 10 during the operations of read, erase and program are to allow the memory cell to be scaled down more effectively. During erase, negative voltage on wordline of selected memory cells allows overall erase voltage to be lowered thus allowing cell dimension to be smaller (sustaining less voltage across various inter-cell or inter-layer dimensional horizontal or vertical spacing, isolation, width, length, etc. . . . ). During program, negative voltage on wordline of unselected memory cells reduces leakage for un-selected memory cells leading to less disturb (for un-selected cells in same sector), more accurate programming current (for selected cells, less leakage interference) and less power consumption. For read, negative voltage on wordline of unselected memory cells leads to more accurate sensing due to less interference from leakage. It is also advantageous to combine negative wordline, negative coupling gate and negative P substrate for use in memory array operation resulting in lowered erase/program voltages and current, more effective erasing and programming, less cell disturb, and less cell leakage.

What is claimed is:

1. A non-volatile memory device comprising:
a semiconductor substrate of a first conductivity type;
an array of non-volatile memory cells in the semiconductor substrate arranged in a plurality of rows and columns, each memory cell comprising:
a first region on a surface of the semiconductor substrate of a second conductivity type;
a second region on the surface of the semiconductor substrate of the second conductivity type;
a channel region between the first region and the second region;
a word line overlying a first portion of the channel region and insulated therefrom, and adjacent to the first region and having little or no overlap with the first region;
a floating gate overlying a second portion of the channel region, adjacent to the first portion, and insulated therefrom and adjacent to the second region;
a coupling gate overlying the floating gate;
an erase gate overlying the second region and insulated therefrom;
a bit line connected to the first region;
a negative charge pump circuit for generating a first negative voltage; and
a control circuit for receiving a command signal and for generating a plurality of control signals to control the application of the first negative voltage to the word line of the unselected memory cells, in response thereto.

2. The non-volatile memory device of claim 1 wherein said plurality of control signals are generated in response to an erase command.

3. The non-volatile memory device of claim 2 wherein said negative charge pump for generating a second negative voltage, and wherein said control circuit for applying the second negative voltage to the coupling gate of the selected memory cell.

4. The non-volatile memory device of claim 1 wherein said plurality of control signals are generated in response to a read command.

5. The non-volatile memory device of claim 1 wherein said plurality of control signals are generated in response to a program command.

6. The non-volatile memory device of claim 1 wherein said negative charge pump is in a triple well in said semiconductor substrate.

7. The non-volatile memory device of claim 1 wherein said memory cells, negative charge pump, control circuit are formed in a semiconductor P substrate provided in a twin wells P-sub CMOS process.

8. The non-volatile memory device of claim 1 wherein said control circuit comprises a negative voltage diode-decoding circuit.

9. The non-volatile memory device of claim 1 wherein said control circuit comprises a negative level shifter circuit and a clocked negative bootstrapping circuit.

10. The non-volatile memory device of claim 1 further comprises a negative test pad circuit that includes a high voltage PMOS transistor and a high voltage NMOS transistor.

11. The non-volatile memory device of claim 1 further comprising a negative regulation circuit having a capacitor-divider-based comparator.

12. The non-volatile memory device of claim 1 wherein said control circuit comprises a current limiter in the high voltage decoder for supplying positive or negative high voltages to said memory cells.

13. A method of operating a non-volatile memory device of the type having a semiconductor substrate of a first conductivity type; an array of non-volatile memory cells in the semiconductor substrate arranged in a plurality of rows and columns; with each memory cell having a first region on a surface of the semiconductor substrate of a second conductivity type; a second region on the surface of the semiconductor substrate of the second conductivity type; a channel region between the first region and the second region, a word line overlying a first portion of the channel region and insulated therefrom, and adjacent to the first region and having little or no overlap with the first region; a floating gate overlying a second portion of the channel region, adjacent to the first portion, and insulated therefrom, and adjacent to the second region; a coupling gate overlying the floating gate; an erase gate overlying the second region and insulated therefrom; a bit line connected to the first region; wherein said method comprising:

applying a first negative voltage to the word line of the unselected memory cells; and applying a non-negative voltage to the word line, bit line, coupling gate, erase gate and second region of the selected memory cell.

14. The method of claim 13 wherein said method is for erasing the selected memory cell.

15. The method of claim 14 wherein a zero voltage is applied to the word line, bit line, coupling gate and second region of the selected memory cell, and a positive voltage is applied to the erase gate of the selected memory cell.

16. The method of claim 15 wherein the negative voltage is applied to the wordline before other voltages are applied to the erase gate and second region of the selected memory cells.

17. The method of claim 13 wherein in said voltage applied to the coupling gate of the selected memory cells is negative.

18. The method of claim 13 wherein said method is for reading the selected memory cell.

19. The method of claim 13 wherein said method is for programming the selected memory cell.

20. The method of claim 13 wherein said method of applying a non-negative voltage to the word line, bit line, coupling gate, erase gate and second region of the selected memory cell is for only the operations of read and program.

21. The method of claim 20, wherein said method further comprising:

applying a second negative voltage to the coupling gate of the selected memory cell during an erase operation.

22. The method of claim 19, wherein said method further comprising:

applying a second negative voltage to the second region of the selected memory cell during a programming operation.

23. The method of claim 21 wherein said second negative voltage is different from the first negative voltage.

24. The method of claim 20 wherein during said programming, the voltage is applied to the coupling gate after the voltage is applied to the erase gate and second region of the selected memory cells.

25. The method of claim 14 wherein during said erase, the voltage is applied to the coupling gate before the voltage is applied to the erase gate of the selected memory cells.

26. The method of claim 14 wherein during said read, the voltage applied to the coupling gate is applied before the voltage is applied to the wordline and bitline of the selected memory cells.

27. The method of claim 14 wherein during said read, the voltage is applied to the coupling gate before the voltage is applied to the erase gate.

* * * * *